(12) United States Patent
Gu et al.

(10) Patent No.: US 12,154,890 B2
(45) Date of Patent: Nov. 26, 2024

(54) MULTI-TIER IC PACKAGE INCLUDING PROCESSOR AND HIGH BANDWIDTH MEMORY

(71) Applicant: Huawei Technologies Co., Ltd., Shenzhen (CN)

(72) Inventors: Shiqun Gu, San Diego, CA (US); Rui Niu, Beijing (CN); Tianqiang Huang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 504 days.

(21) Appl. No.: 17/388,455

(22) Filed: Jul. 29, 2021

(65) Prior Publication Data

US 2021/0358894 A1 Nov. 18, 2021

Related U.S. Application Data

(63) Continuation of application No. PCT/US2019/038692, filed on Jun. 24, 2019.

(Continued)

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3157* (2013.01); *H01L 23/481* (2013.01);
(Continued)

(58) Field of Classification Search
CPC ........... H01L 23/49822; H01L 23/5383; H01L 23/5386; H01L 2924/30105;
(Continued)

(56) References Cited

U.S. PATENT DOCUMENTS

2012/0080770 A1 4/2012 Wahl
2016/0049385 A1 2/2016 Yu et al.
(Continued)

FOREIGN PATENT DOCUMENTS

WO 2009022991 A1 2/2009
WO 2016140818 A2 9/2016

*Primary Examiner* — Jay C Chang
*Assistant Examiner* — Mikka Liu
(74) *Attorney, Agent, or Firm* — Slater Matsil, LLP

(57) ABSTRACT

A packaged IC includes a fanout layer, an Application Processor (AP) die having a first surface residing substantially adjacent a first surface of the fanout layer, a Redistribution Layer (RDL) having a first surface coupled to a second surface of the AP die Process, and high bandwidth memory coupled to a second surface of the RDL and configured to communicate wirelessly with the AP die. The packaged IC further includes an encapsulant surrounding a substantial portion of the high bandwidth memory, the RDL, and the AP die, the encapsulant contacting the fanout layer on a first side and having an exposed second side, a plurality of conductive posts extending from the fanout layer to the RDL through a portion of the encapsulant, and a plurality of Through Mold Vias (TMVs) extending between the fanout layer and the exposed second side of the encapsulant.

20 Claims, 8 Drawing Sheets

Related U.S. Application Data

(60) Provisional application No. 62/798,954, filed on Jan. 30, 2019.

(51) Int. Cl.
*H01L 23/31* (2006.01)
*H01L 23/48* (2006.01)
*H01L 23/498* (2006.01)
*H01L 23/538* (2006.01)
*H01L 25/00* (2006.01)

(52) U.S. Cl.
CPC .. *H01L 23/49816* (2013.01); *H01L 23/49822* (2013.01); *H01L 23/49838* (2013.01); *H01L 23/5383* (2013.01); *H01L 23/5386* (2013.01); *H01L 24/16* (2013.01); *H01L 24/17* (2013.01); *H01L 24/24* (2013.01); *H01L 25/50* (2013.01); *H01L 2224/16235* (2013.01); *H01L 2224/17134* (2013.01); *H01L 2224/24145* (2013.01); *H01L 2225/1023* (2013.01); *H01L 2225/1041* (2013.01); *H01L 2225/1058* (2013.01); *H01L 2924/1433* (2013.01); *H01L 2924/14335* (2013.01); *H01L 2924/1434* (2013.01); *H01L 2924/182* (2013.01); *H01L 2924/30105* (2013.01); *H01L 2924/30107* (2013.01)

(58) Field of Classification Search
CPC . H01L 2924/30107; H01L 2924/14335; H01L 2924/1434
See application file for complete search history.

(56) References Cited

U.S. PATENT DOCUMENTS

| | | | |
|---|---|---|---|
| 2016/0079205 A1* | 3/2016 | Lin | H01L 24/25 257/737 |
| 2016/0247784 A1 | 8/2016 | Wang | |
| 2017/0133351 A1* | 5/2017 | Su | H01L 23/5389 |
| 2018/0174865 A1 | 6/2018 | Yu et al. | |
| 2018/0350745 A1 | 12/2018 | Hsieh et al. | |

* cited by examiner

MULTI-TIER IC PACKAGE INCLUDING PROCESSOR AND HIGH BANDWIDTH MEMORY

CROSS-REFERENCE TO RELATED APPLICATIONS

This Application is a continuation of PCT/US2019/038692, filed on Jun. 24, 2019, which claims priority pursuant to 35 U.S.C. § 119(e) to U.S. Provisional Application No. 62/798,954, entitled "MULTI-TIER PROCESSOR/MEMORY PACKAGE", filed Jan. 30, 2019, which is hereby incorporated herein by reference in its entirety and made part of the present U.S. Utility Patent Application for all purposes.

TECHNICAL FIELD

The present application relates to Integrated Circuit (IC) technology; and more particularly to the packaging of processors with memory.

BACKGROUND

Integrated Circuit (IC) technology has advanced greatly over the past fifty years. ICs are now pervasive and present in electronic devices, machinery, vehicles, appliances, and many other devices. Large processing ICs now include billions of transistors while memory ICs include hundreds of billions of transistors. The density of transistors on ICs can reach 100 million transistors per square millimeter. However, the processing capability of a single IC may not be sufficient to meet required processing needs. Thus, ICs are packaged so that the multiple ICs are closely coupled and provide greater processing capabilities.

Multiple IC packages are used in a great number of differing devices, including mobile communication devices, artificial intelligence devices, graphics processing units, among other devices. Typically, an Application Processor (AP) die used in such devices includes specialized processing structure to service the particular application, e.g., communications processor, graphics processor, etc. The AP die typically has large memory requirements, which must provide large memory bandwidth as well as rapid access. Thus, multiple IC packages now include both an AP die and high bandwidth memory.

Current POP (Package on Package) packages use memory that provides up to 25.6 GBps peak bandwidth for LPDDR (Low Power Double Data Rate with x32 DQ pins, e.g., $5^{th}$ Generation) installations. Increasing the communication Band Width (BW) may be achieved by either increasing pin width or increasing Input/Output (IO) speed. With large solder ball pitch, the pin count for LPDDR is limited. To increase IO speed beyond 6.4 Gbps would be very difficult due to increases in power consumption, which compromises signal integrity. Prior art alternatives stacked WTO (Wide Input/Output) memory on a back-side processor, which required TSV (Though Silicon Vias). Another prior art solution was to use an interposer or lateral fan out connection with a fine pitch Redistribution Layer (RDL), which increases package size. Still other prior art alternatives required vias that extended through the AP die. Other prior art alternatives had other shortcomings such as strict alignment requirements, through AP die vias, poor signal pathways, and other shortcomings.

SUMMARY

According to a first embodiment of the present disclosure, a packaged Integrated Circuit (IC) includes a fanout layer, an Application Processor (AP) die having a first surface residing substantially adjacent a first surface of the fanout layer, a Redistribution Layer (RDL) having a first surface coupled to a second surface of the AP die, high bandwidth memory coupled to a second surface of the RDL and configured to communicate wirelessly with the AP die, an encapsulant surrounding a substantial portion of the high bandwidth memory, the RDL, and the AP die, the encapsulant contacting the fanout layer on a first side and having an exposed second side, a plurality of conductive posts extending from the fanout layer to the RDL through a portion of the encapsulant, and a plurality of Through Mold Vias (TMVs) extending between the fanout layer and the exposed second side of the encapsulant.

The packaged IC provides important benefits by enabling high bandwidth communications between the AP die and the high bandwidth memory in a compact structure. These important benefits also apply to the second and third embodiments described herein.

The first embodiment includes a number of optional aspects, which may be applied to the first embodiment singularly or in combination thereto in any manner. According to a first aspect of the first embodiment, the RDL includes electrical conductors enabling the high bandwidth memory to communicate wirelessly with the AP die. According to a second aspect of the first embodiment, a portion of the high bandwidth memory resides outside a footprint of the AP die. According to a third aspect of the first embodiment, the high bandwidth memory resides within a footprint of the AP die. According to a fourth aspect, the packaged IC includes a dummy silicon substrate residing beside the high bandwidth memory. According to a fifth aspect, the packaged IC includes a ball grid array coupled to the plurality of TMVs and Package on Package (POP) memory coupled to the ball grid array. According to a sixth aspect, the packaged IC further includes a PCB ball grid array coupled to a second surface of the fanout layer.

A second embodiment of the present disclosure is directed to a method for constructing a packaged IC. The method includes fabricating a second plurality of TMVs on a carrier, placing a high bandwidth memory on the carrier, molding and polishing a second encapsulant to expose the second plurality of TMVs, fabricating a RDL on the second encapsulant that couples to the second plurality of TMVs, fabricating a first plurality of TMVs on the redistribution layer, placing an AP die on the redistribution layer, molding and polishing a first encapsulant to expose the first plurality of TMVs, fabricating a fanout layer on the first encapsulant to substantially complete the packaged IC, and demounting the packaged IC from the carrier.

The second embodiment includes a number of optional aspects, which may be applied to the first embodiment singularly or in combination thereto in any manner. According to a first aspect of the second embodiment, the RDL, includes electrical conductors enabling the high bandwidth memory to communicate wirelessly with the AP die. According to a second aspect of the second embodiment, a portion of the high bandwidth memory resides outside a footprint of the AP die. According to a third aspect of the second embodiment, the high bandwidth memory resides within a footprint of the AP die.

According to a fourth aspect of the second embodiment, the method further includes placing a dummy silicon substrate beside the high bandwidth memory, wherein the second encapsulant surrounds at least a substantial portion of the dummy silicon substrate. According to a fifth aspect of the second embodiment, the method further includes forming a ball grid array on the second encapsulant that couples to the plurality of TMVs and placing POP memory on the ball grid array. According to a sixth aspect of the second embodiment, the method further includes forming a ball grid array on the redistribution layer.

A third embodiment of the present disclosure is directed to a packaged IC that includes a fanout layer, an AP die having a first surface residing substantially adjacent a first surface of the fanout layer, a plurality of conductive posts extending from the fanout layer, a first encapsulant surrounding a substantial portion of the AP die and the plurality of conductive posts, the first encapsulant contacting the fanout layer on a first side and having an exposed second side, a first plurality of TMVs extending from the fanout layer through the first encapsulant, a RDL having a first surface coupled to a second surface of the AP die, high bandwidth memory coupled to a second surface of the RDL and configured to communicate wirelessly with the AP die, a second encapsulant surrounding a substantial portion of the high bandwidth memory and the RDL and a second plurality of TMVs extending from the first plurality of TMVs through the second encapsulant.

The third embodiment includes a number of optional aspects, which may be applied to the first embodiment singularly or in combination thereto in any manner. According to a first aspect of the third embodiment, the RDL includes electrical conductors enabling the high bandwidth memory to communicate wirelessly with the. AP die. According to a second aspect of the third embodiment, the high bandwidth memory resides within a footprint of the AP die. According to a third aspect of the third embodiment, a portion of the high bandwidth memory resides outside of a footprint of the AP die. According to a fourth aspect of the third embodiment, the packaged IC further includes a ball grid array coupled to the plurality of TMVs and a POP memory coupled to the ball grid array. According to a fifth aspect of the third embodiment, the packaged further includes a PCB ball grid array coupled to a second surface of the fanout layer.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION OF ILLUSTRATIVE EMBODIMENTS

Figure 1:
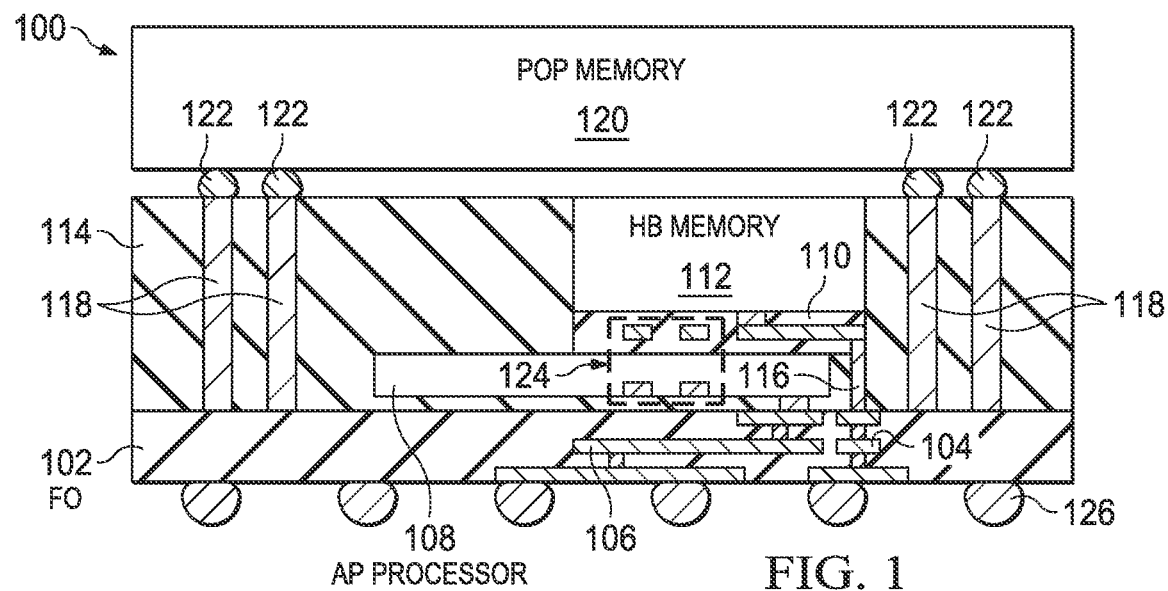
FIG. 1 is a sectional side view illustrating a packaged integrated Circuit (IC) constructed according to a first described embodiment.

FIG. 1 is a sectional side view illustrating a packaged integrated Circuit (IC) constructed according to a first described embodiment. The packaged IC100 includes a fanout layer 102 having signal conductors and vias 106 and power conductors and vias 104. The fanout layer may be formed in a semiconductor manufacturing process. An Application Processor (AP) die 108 has a first surface residing substantially adjacent a first surface of the fanout layer 102. The AP die mob may be a video processor, a communications processor, a general-purpose processor, an application specific processor, or another type of processor. The AP die 108 may mount directly to the fanout layer 102 or mount upon an intermediary layer.

A fanout Redistribution Layer (RDL) 110 having a first surface couples to a second surface of the AP die 108. The RDL 110 may also be formed in a semiconductor manufacturing process and provides power conductors formed therein that couple to the power conductors and vias 104 of the fanout layer 102. Such power coupling may be serviced by a conductive post All of these power and/or signal conductors may be formed of Copper with dimensions greater than one micrometer, for example.

High bandwidth memory 112 couples to a second surface of the RIM, 110 and is configured to communicate wirelessly 124 with the AP die 108, e.g., via inductive coupling, capacitive coupling or Radio Frequency (RF) coupling. The high bandwidth memory 112 may include antennas, contacts, and/or coils to assist with the wireless communications 124. The AP die 108 may also include antennas, contacts, and/or coils to support wireless communications with the high bandwidth memory 112. In an alternate construct, the antennas, contacts, and/or coils may be formed external to the high bandwidth memory and/or the AP die 108 and electrically couple thereto.

The high bandwidth memory 112 may be any type of memory that supports the high bandwidth storage requirements of the AP die 108. The wireless communications 124 supports the transfer of data on a high bandwidth basis between the AP die 108 and the high bandwidth memory 112 with reduce power consumption as compared to wired connections. The communication coil could be embedded into the metal layers of the high bandwidth memory 112, and the metal layers of the AP die 108. For example, the high bandwidth memory 112 may be RAM, ROM, static RAM, optical memory, or another memory type.

An encapsulant 114 surrounds a substantial portion of the high bandwidth memory 112, the RDL no, and the AP die 108. The encapsulant contacts the fanout layer 102 on a first side and has an exposed second side. An optional backside RDL or molding may be mounted or formed on an upper surface of the high bandwidth memory 112 or encapsulant 114. A plurality of conductive posts 116 extend from the fanout layer 102 to the RDL 110 through a portion of the encapsulant 114. A plurality of Through Mold Vias (TMVS) 118 extend between the fanout layer 102 and the exposed second side of the encapsulant 114. The TMVs 118 support communications and power delivery between the fanout layer 102 and Package on Package (POP) memory 120 that provide additional storage resources to the AP die 108. A ball grid array 122 couples to the plurality of TMVs 118 and provides connections between the fanout layer 102 and the POP memory 120. The packaged IC 100 may also include a Printed Circuit Board (PCB) ball grid array 126 coupled to the fanout layer 102 that supports mounting of the packaged IC 100 to a PCB.

The RDL 110 may include electrical conductors enabling the high bandwidth memory 112 to communicate wirelessly 124 with the AP die 108. With the packaged IC 100 of FIG. 1, a portion of the high bandwidth memory 112 resides outside a footprint of the AP die 108, i.e., the high bandwidth memory 112 overlaps the AP die 108.

Figure 2:
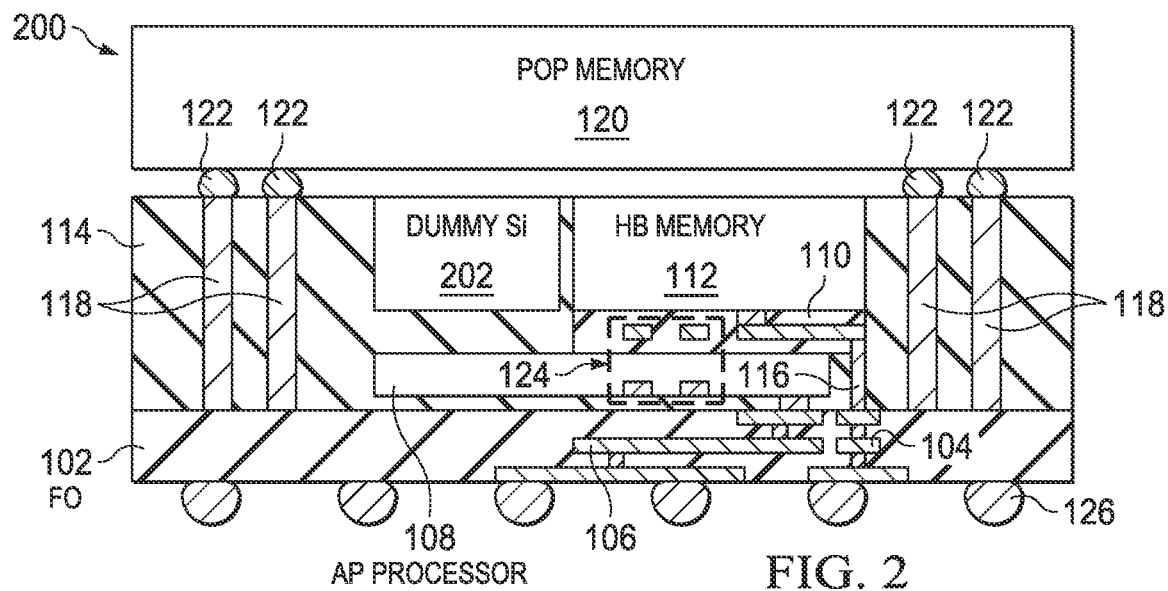
FIG. 2 is a sectional side view illustrating a packaged IC constructed according to a second described embodiment

FIG. 2 is a sectional side view illustrating a packaged IC constructed according to a second described embodiment. The packaged IC 200 of FIG. 2 is substantially similar to the packaged IC 100 of FIG. 1 with the addition of a dummy silicon substrate 202 residing beside the high bandwidth memory 112 within the encapsulant 114. The dummy silicon substrate 202 has similar thermal expansion properties as do the high bandwidth memory 112 and the AP die 108 to reduce stress on the packaged IC 200.

Figure 3:
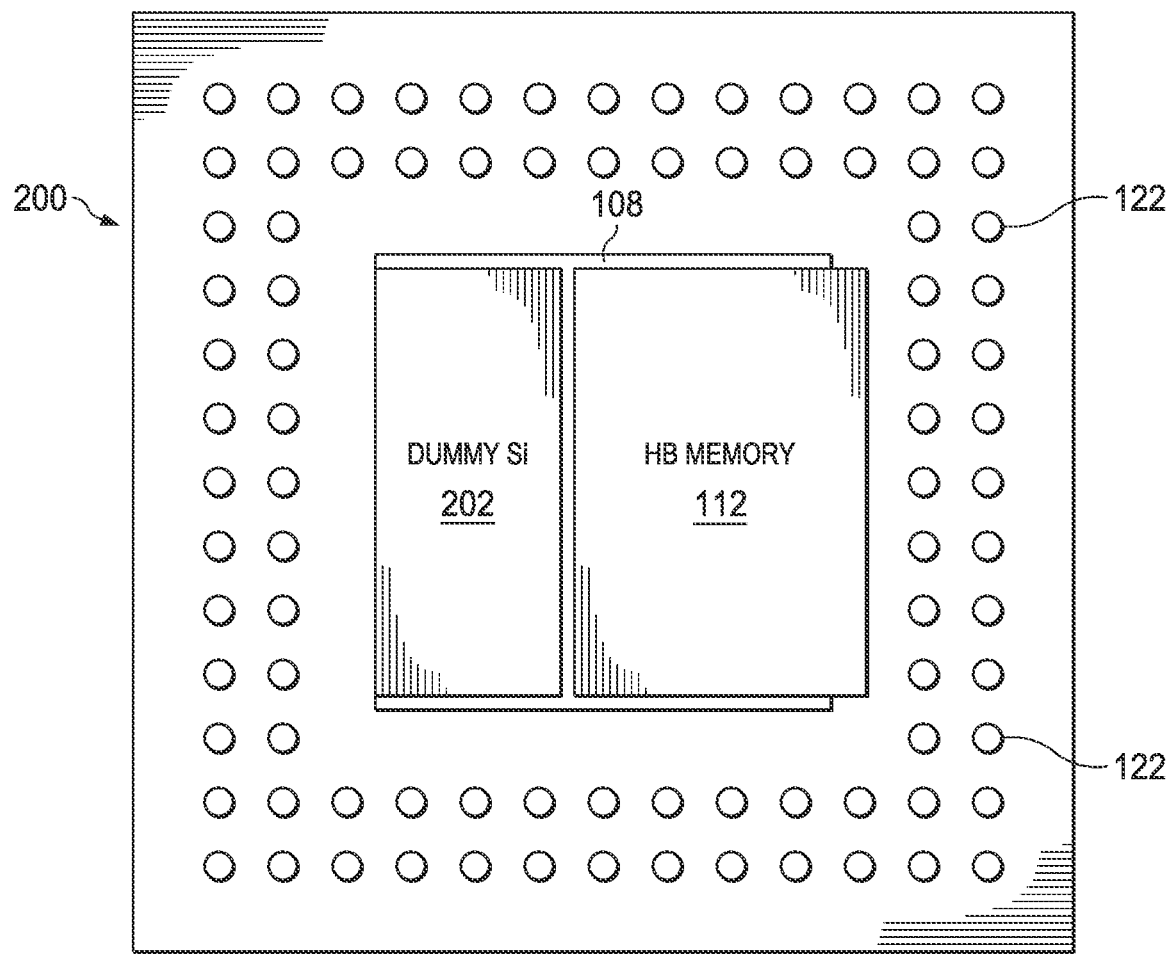
FIG. 3 is a diagrammatic top view of a portion of the packaged IC of FIG. 2.

FIG. 3 is a diagrammatic top view of a portion of the packaged IC of FIG. 2. Illustrated in FIG. 2 of the packaged IC 200 are the AP die 108 with the high bandwidth memory 112 and the dummy silicon substrate 202 residing above. The ball grid array 122 is shown but the POP memory 120 is not shown. As illustrated in FIG. 2, a portion of the high bandwidth memory 112 resides outside a footprint of the AP die 108, i.e., the high bandwidth memory 112 overlaps the AP die 108.

Figure 4:
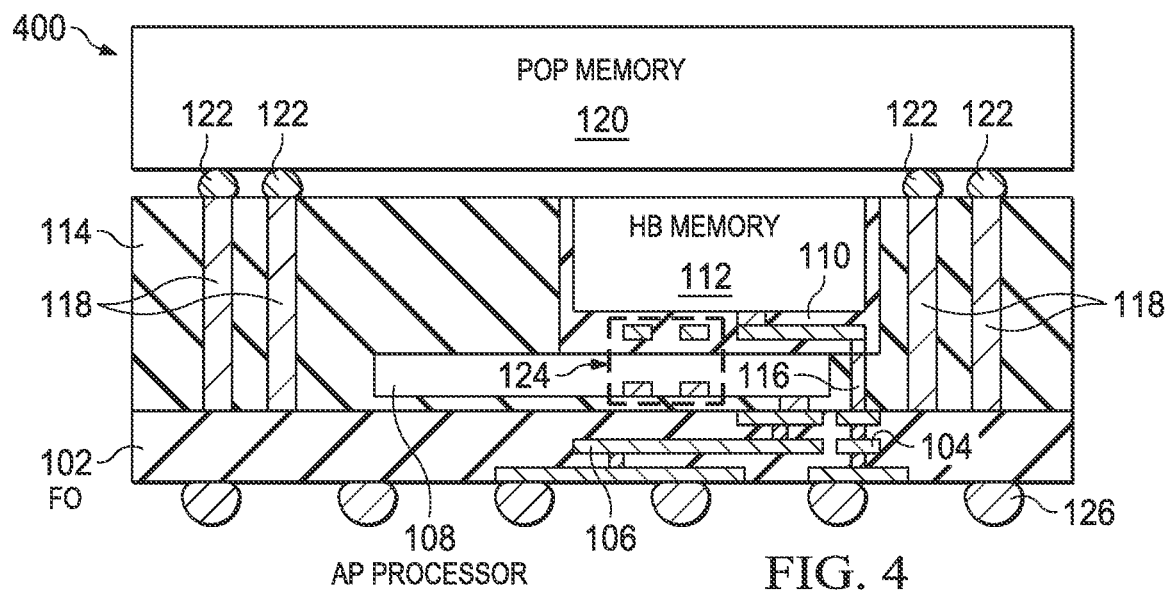
FIG. 4 is a sectional side view illustrating a packaged IC constructed according to a third described embodiment.

FIG. 4 is a sectional side view illustrating a packaged IC constructed according to a third described embodiment. The packaged IC 400 of FIG. 4 is similar to the packaged IC too of FIG. 1 except that the high bandwidth memory 112 resides within a footprint of the AP die 108.

Figure 5:
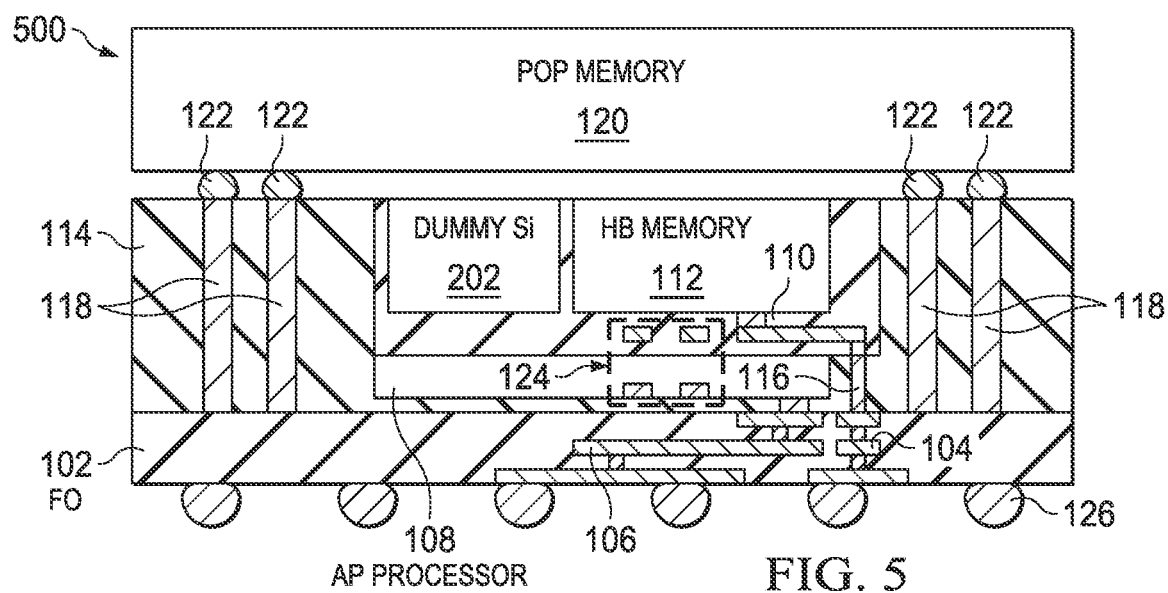
FIG. 5 is a sectional side view illustrating a packaged IC constructed according to a fourth described embodiment.

FIG. 5 is a sectional side view illustrating a packaged IC constructed according to a fourth described embodiment. The packaged IC 500 of FIG. 5 is similar to the packaged IC 200 of FIG. 2 except that the high bandwidth memory 112 resides within a footprint of the AP die 108. The high bandwidth memory 112 and the dummy silicon substrate 202 are encapsulated into one mold first, with the RDI, 110 outside the high bandwidth memory 112 foot print.

Figure 6:
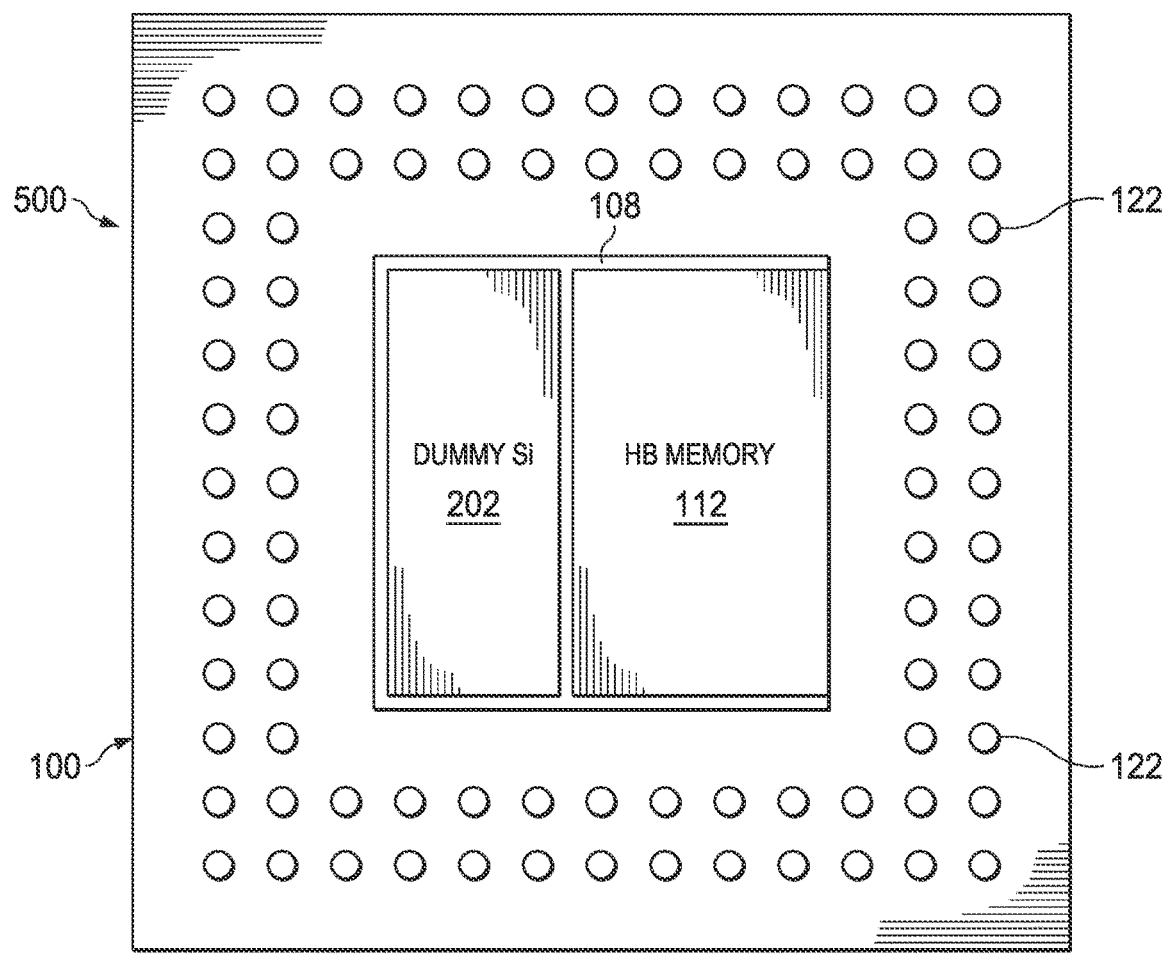
FIG. 6 is a diagrammatic top view of a portion of the packaged IC of FIG. 5.

FIG. 6 is a diagrammatic top view of a portion of the packaged IC of FIG. 5. Illustrated in FIG. 6 are the AP die 108, the high bandwidth memory 112, and the dummy silicon substrate 202 residing above. The ball grid array 122 is also shown but the POP memory 120 is not shown. As illustrated in FIG. 2, a portion of the high bandwidth memory 112 resides outside a footprint of the AP die 108, i.e., the high bandwidth memory 112 overlaps the AP die 108. The high bandwidth memory 112 may reside within a footprint of the AP die 108. The packaged IC 500 may further include a dummy silicon substrate 202 residing beside the high bandwidth memory at least partially within the encapsulant.

Figure 7:
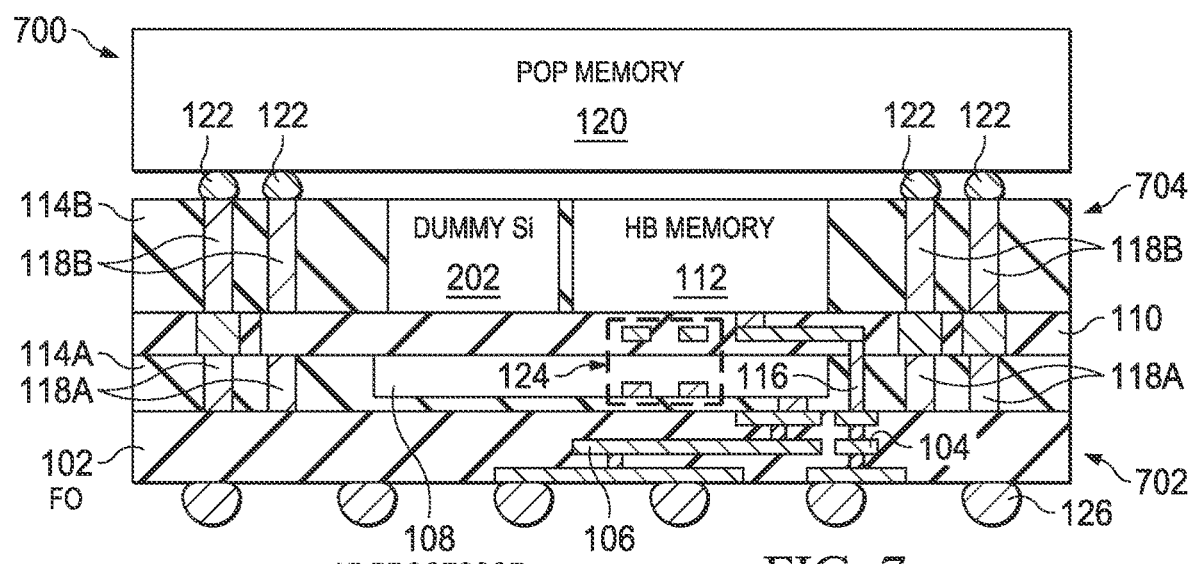
FIG. 7 is a sectional side view illustrating a packaged IC constructed according to a fifth described embodiment.

FIG. 7 is a sectional side view illustrating a packaged IC constructed according to a fifth described embodiment. The packaged IC 700 includes elements same/similar to those described previously with reference to FIGS. 1 through 6, which retain common numbering and which may be constructed in a similar fashion as described therewith. The packaged IC 700 of FIG. 7 is shown with additional detail that results from manufacture that may be consistent with the operations 800 of FIG. 8.

The packaged IC 700 includes a fanout layer 102, the RDL 110, and two distinct mold layers 702 and 704. The first mold layer 702 includes an AP die 108 having a first surface residing substantially adjacent a first surface of the fanout layer 102, a first plurality of TMVs 118A, and conductive posts 116, most/all of which are substantially surrounded by a first encapsulant 114A. The second mold layer 704 includes a high bandwidth memory 112, a dummy silicon substrate 202, and a second plurality of TMVs 118B, most/all of which are substantially surrounded by a second encapsulant 114B. The RDL 110 resides between the first mold layer 702 and the second mold layer 704 and has a first surface coupled to a second surface of the AP die 108. A high bandwidth memory 112 couples to a second surface of the RDL 110 and is configured to communicate wirelessly 124 with the AP die 108.

As shown in FIG. 7, the high bandwidth memory 112 resides within a footprint of the AP die 108. The packaged IC 700 may further include a dummy silicon substrate 202 residing beside the high bandwidth memory 112 at least partially within the second encapsulant 114B. The packaged IC 700 may also include ball grid arrays 122 and 126 and a POP memory 120.

Figure 8:
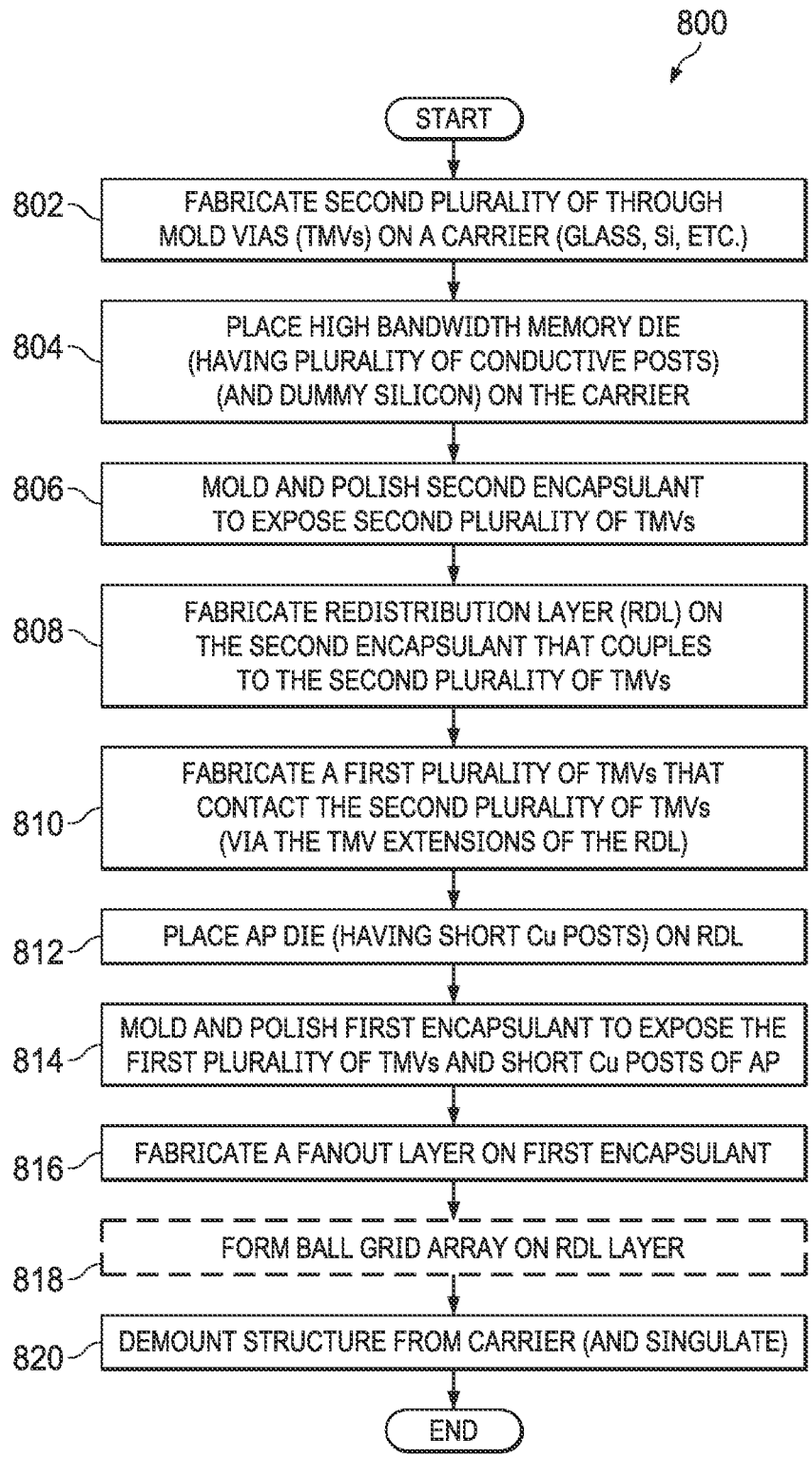
FIG. 8 is a flow chart illustrating operations for constructing a packaged IC according to an embodiment of the present disclosure.

FIG. 8 is a flow chart illustrating operations for constructing a packaged IC according to an embodiment of the present disclosure. The operations 800 of FIG. 8 are described with further reference to FIGS. 9A-J, which illustrate the packaged IC during various steps in its construction. Conventional semiconductor manufacturing techniques may be employed with the operations 800 of FIG. 8 to construct the packaged IC. Numbering of FIGS. 9A-J is consistent with the numbering of FIG. 7 (and mostly consistent with the numbering of earlier FIGS.). Operations 800 include first fabricating a second plurality of TMVs 118B on a carrier 902 (step 802, with reference to FIG. 9A). Operations 800 continue with placing a high bandwidth memory die 112 (having a plurality of conductive posts 904) on the carrier 902 (step 804, with reference to FIG. 9B). Step 804 includes optionally also placing a dummy silicon substrate 202 on the earlier 902.

Figure 9A:
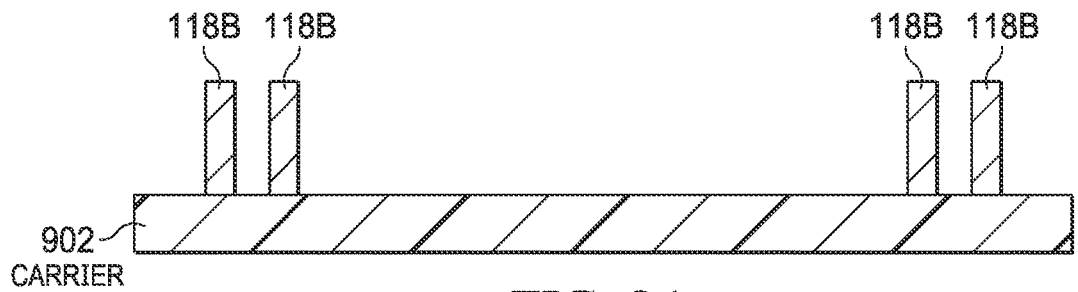
FIGS. 9A-J are diagrammatic sectional side views of the packaged IC during manufacture consistent with the operations of FIG. 8.
Figure 9B:
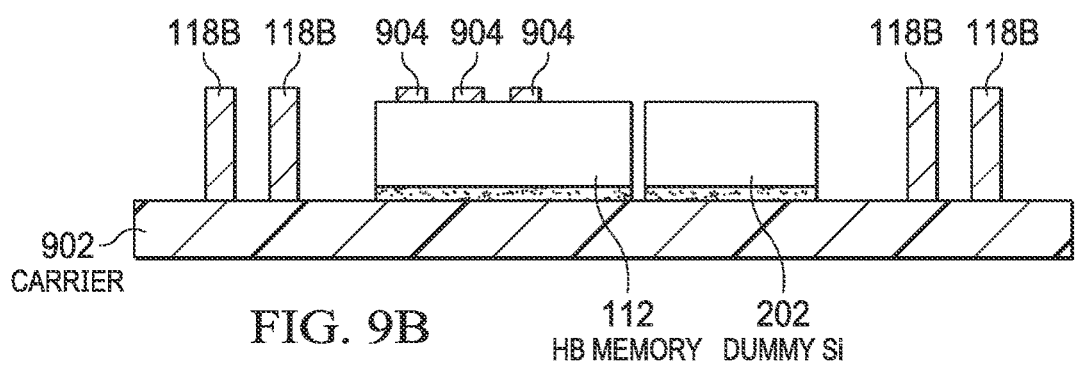
Figure 9C:
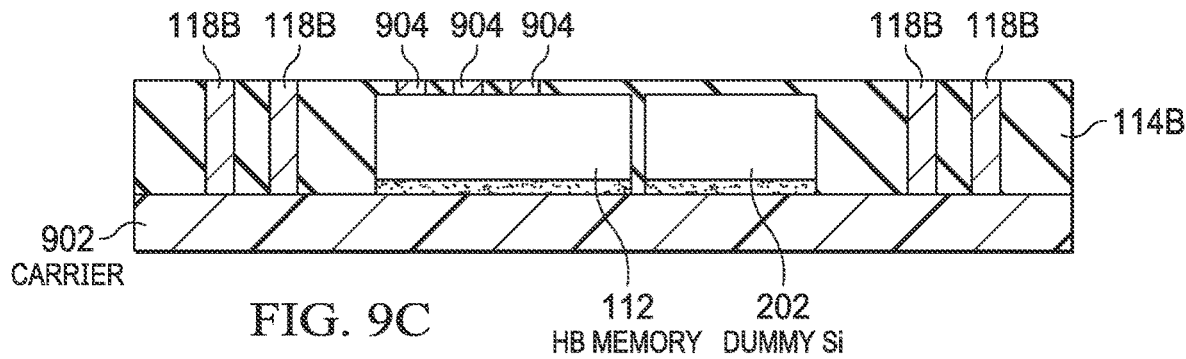
Figure 9D:
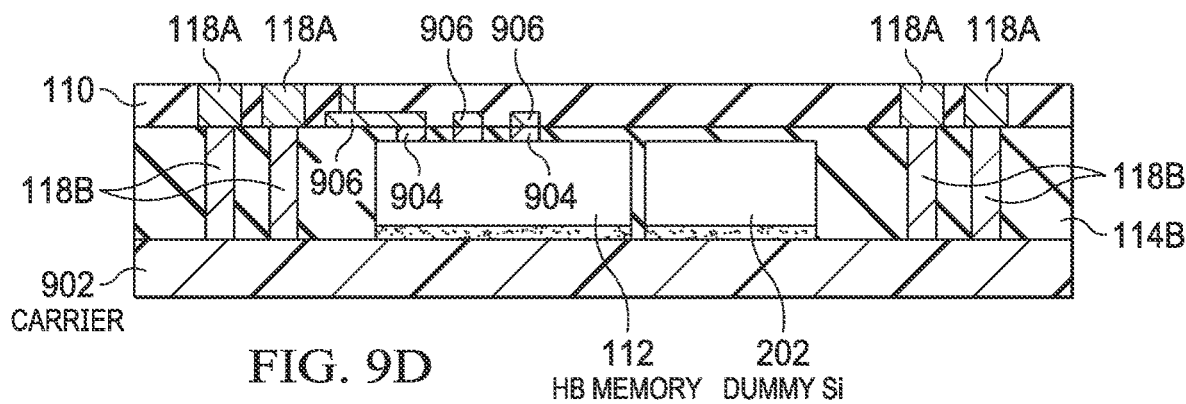
Figure 9E:
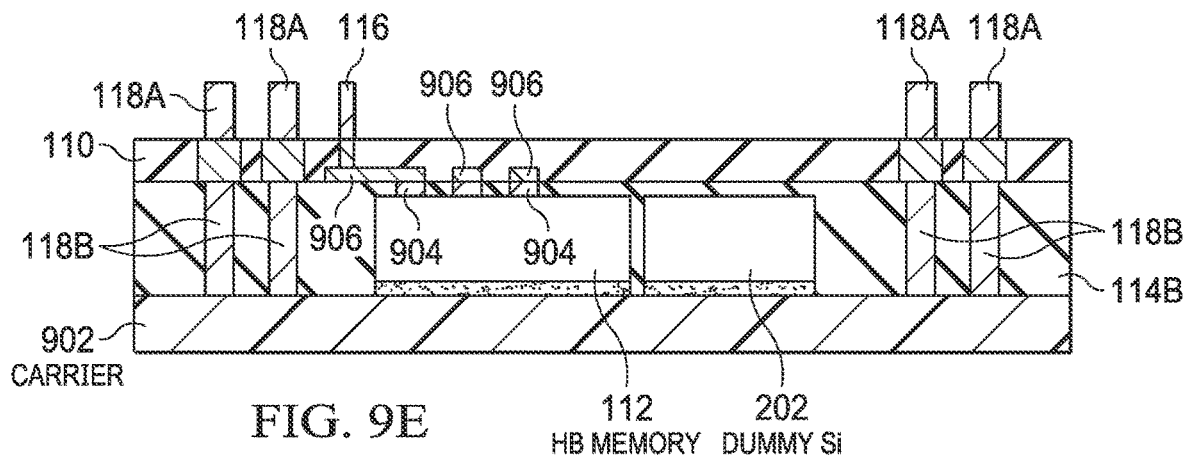
Figure 9F:
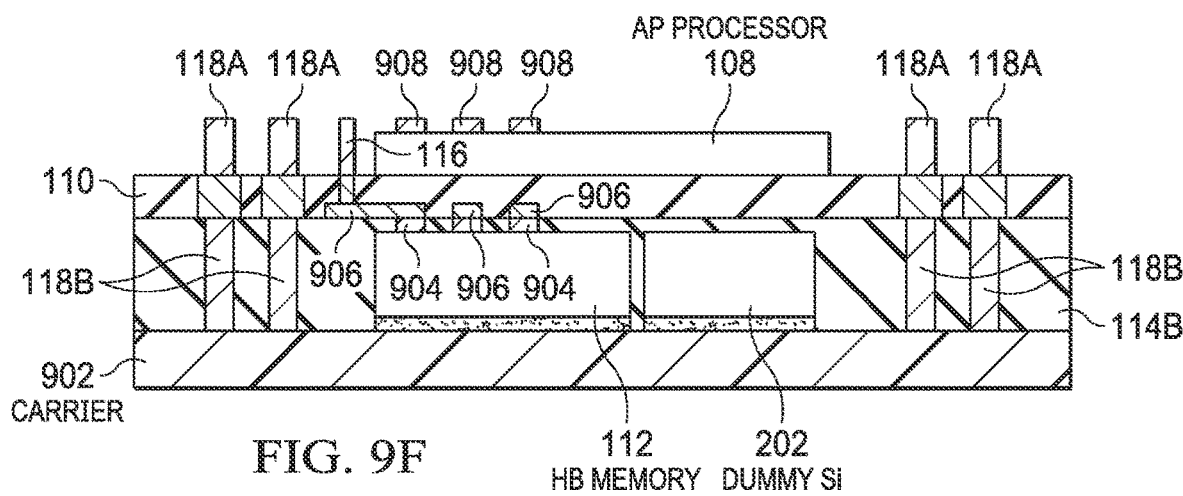
Figure 9G:
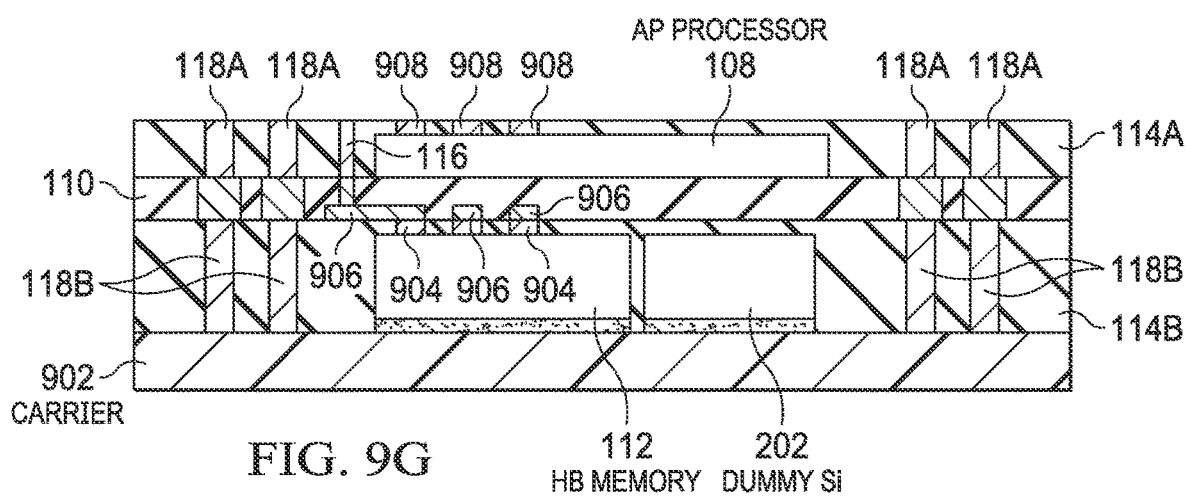
Figure 9H:
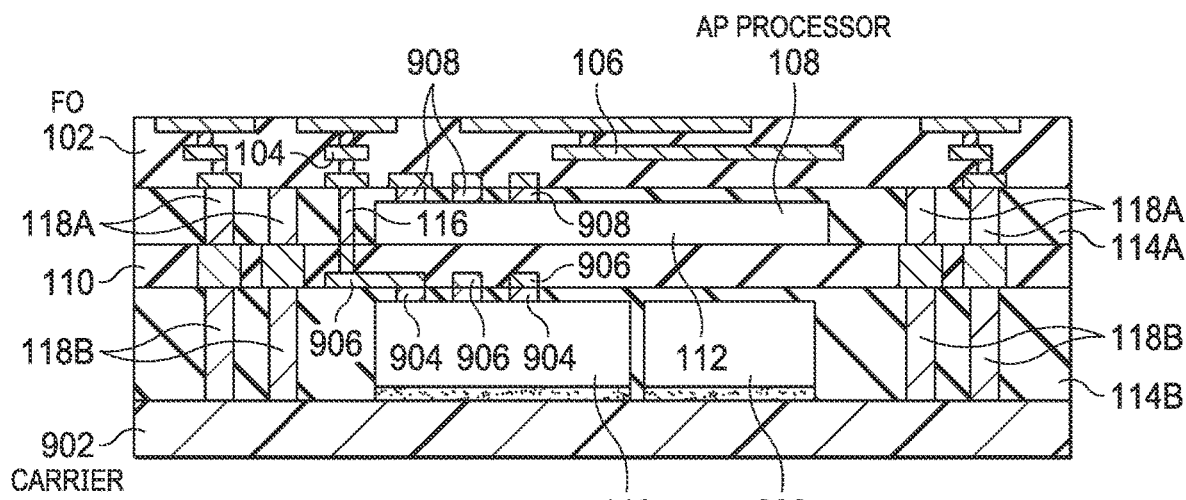
Figure 9I:
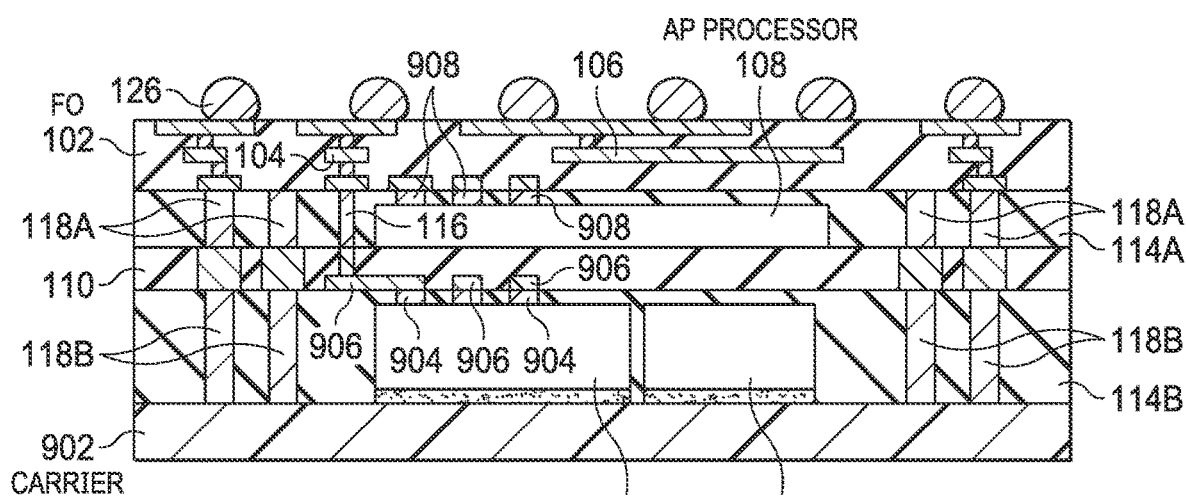
Figure 9J:
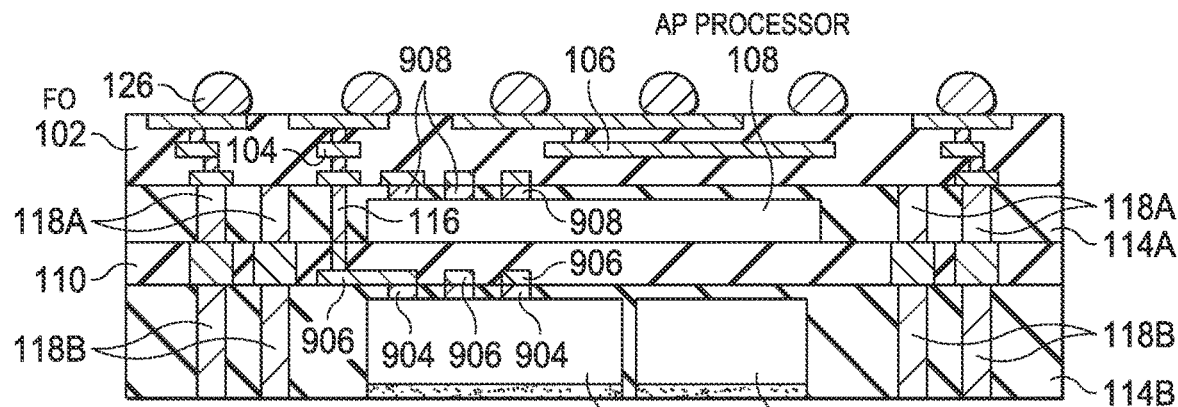

Operations continue with molding and polishing a second encapsulant 114B to expose the second plurality of TMVs 118B (and a plurality of conductive posts 904 of the high bandwidth memory) (step 806, with reference to FIG. 9C). Operations 800 continue with fabricating an RDL 110 on the second encapsulant 114B that has conductive traces 906 that couple to the conductive posts 904 of the high bandwidth memory 112 (step 808, with reference to FIG. 9D) Step 808 may further include forming TMV extensions that couple to the second plurality of TMVs 118B. Operations 800 then include fabricating a first plurality of TMVs 118A that contact the second plurality of TMV 118B (via the TMV extensions of the RDL 110) (step 810, with reference to FIG. 9E), Operations 800 continue with placing an AP die 108 (having short conductors, e.g., copper posts 908) on the RDL 110 (step 812, with reference to FIG. 9F). Operations 800 then continue with molding and polishing a first encapsulant 114A to expose the first plurality of TMVs 118A and the short copper posts 908 of the AP die (step 814, with reference to FIG. 9G), Operations 800 continue with fabricating a fanout layer 102 on the first encapsulant 114A having signal conductors 1o6 and power conductors 104 (step 816, with reference to FIG. 9H). Operations 800 continue with optionally forming a ball grid array 126 on the fanout layer 102 (step 818, with reference to FIG. 9I). Operations 800 conclude with demounting the packaged structure from the carrier 902 (and singulated a multi component structure if required) (step 820, with reference to FIG. 9J).

With the operations 800 of FIG. 8, the RDL 110 may include electrical conductors enabling the high bandwidth memory 112 to communicate wirelessly with the AP die 108. Further, a portion of the high bandwidth memory 112 may reside outside a footprint of the AP die 108 or the high bandwidth memory 112 resides within a footprint of the AP die 108.

It should be understood at the outset that, although illustrative implementations of one or more embodiments are provided below, the disclosed systems and/or methods may be implemented using any number of techniques, whether currently known or in existence. The disclosure should in 110 way be limited to the illustrative implementations, drawings, and techniques illustrated below, including the exemplary designs and implementations illustrated and described herein, but may be modified within the scope of the appended claims along with their full scope of equivalents.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

The invention claimed is:

1. A packaged Integrated Circuit (IC) comprising:
   a fanout layer;
   an Application Processor (AP) die, a first surface of the AP die adjacent to a first surface of the fanout layer;
   a Redistribution Layer (RDL), a first surface of the RDL coupled to a second surface of the AP die;
   a high bandwidth memory coupled to a second surface of the RDL and configured to communicate wirelessly with the AP die;
   an encapsulant surrounding at least a portion of the high bandwidth memory, the RDL, and the AP die, a first side of the encapsulant contacting the fanout layer and a second side of the encapsulant being at least partially exposed;
   a plurality of conductive posts extending from the fanout layer to the RDL through a portion of the encapsulant; and
   a plurality of Through Mold Vias (TMVs) extending between the fanout layer and the second side of the encapsulant.

2. The packaged IC of claim 1, wherein the RDL includes electrical conductors adapted to enable wireless communication between the high bandwidth memory and the AP die.

3. The packaged IC of claim 1, wherein a second portion of the high bandwidth memory resides outside a footprint of the AP die.

4. The packaged IC of claim 1, wherein the high bandwidth memory resides within a footprint of the AP die.

5. The packaged IC of claim 1, further comprising a dummy silicon substrate adjacent to the high bandwidth memory.

6. The packaged IC of claim 1, further comprising:
   a ball grid array coupled to the plurality of TMVs; and
   a Package on Package (POP) memory coupled to the ball grid array.

7. The packaged IC of claim 1, further comprising a Printed Circuit Board (PCB) ball grid array coupled to a second surface of the fanout layer.

8. A packaged Integrated Circuit (IC) comprising:
   a fanout layer;
   an Application Processor (AP) die, a first surface of the AP die adjacent to a first surface of the fanout layer;
   a plurality of conductive posts extending from the fanout layer;
   a first encapsulant surrounding at least a portion of the AP die and the plurality of conductive posts, the first encapsulant contacting the fanout layer on a first side of the first encapsulant, the first encapsulant including an exposed second side;
   a first plurality of Through Mold Vias (TMVs) extending from the fanout layer through the first encapsulant;
   a Redistribution Layer (RDL) including a first surface coupled to a second surface of the AP die;
   a high bandwidth memory coupled to a second surface of the RDL, the high bandwidth memory configured to communicate wirelessly with the AP die;
   a second encapsulant surrounding at least a portion of the high bandwidth memory and the RDL; and
   a second plurality of TMVs extending from the first plurality of TMVs through the second encapsulant.

9. The packaged IC of claim 8, wherein the RDL includes electrical conductors adapted to enable the high bandwidth memory to communicate wirelessly with the AP die.

10. The packaged IC of claim 8, wherein the high bandwidth memory resides within a footprint of the AP die.

11. The packaged IC of claim 8, wherein a second portion of the high bandwidth memory resides outside of a footprint of the AP die.

12. The packaged IC of claim 8, further comprising:
    a ball grid array coupled to the plurality of TMVs; and
    a Package on Package (POP) memory coupled to the ball grid array.

13. The packaged IC of claim 8, further comprising a Printed Circuit Board (PCB) ball grid array coupled to a second surface of the fanout layer.

14. A packaged Integrated Circuit (IC) comprising:
    a fanout layer;
    an Application Processor (AP) die on the fanout layer;
    a fanout Redistribution Layer (RDL) on the AP die;
    a high bandwidth memory on the fanout RDL and configured to communicate wirelessly with the AP die;
    an encapsulant surrounding at least a portion of the AP die; and
    a plurality of conductive posts extending from the fanout layer through the encapsulant.

15. The packaged IC of claim 14, the fanout layer including signal conductors and power conductors.

16. The packaged IC of claim 14, the high bandwidth memory configured to communicate wirelessly with the AP die via inductive coupling, capacitive coupling or Radio Frequency (RF) coupling.

17. The packaged IC of claim 14, the AP die including antennas for supporting wireless communications with the high bandwidth memory.

18. The packaged IC of claim 14, the high bandwidth memory including a communication coil for supporting wireless communications with the AP die, the communication coil embedded into metal layers of the high bandwidth memory.

19. The packaged IC of claim 14, further including:
    a backside RDL or a molding on the high bandwidth memory.

20. The packaged IC of claim 14, further including:
a Package on Package (POP) memory; and
a plurality of Through Mold Vias (TMVs) extending from the fanout layer, the plurality of TMVs for supporting communications and power delivery between the fanout layer and the POP memory.

* * * * *